US012563708B2

(12) United States Patent
Lin et al.

(10) Patent No.: US 12,563,708 B2
(45) Date of Patent: Feb. 24, 2026

(54) DISPLAY COOLED BY INTERNAL AND EXTERNAL AIRFLOWS CIRCULATION

(71) Applicant: Shenzhen Luxci Industrial Co., Ltd., Guangdong (CN)

(72) Inventors: Huiquan Lin, Guangdong (CN); Min Xie, Guangdong (CN)

(73) Assignee: Shenzhen Luxci Industrial Co., Ltd., Shenzhen (CN)

( * ) Notice: Subject to any disclaimer, the term of this patent is extended or adjusted under 35 U.S.C. 154(b) by 268 days.

(21) Appl. No.: 18/211,581

(22) Filed: Jun. 19, 2023

(65) Prior Publication Data

US 2023/0413497 A1      Dec. 21, 2023

(30) Foreign Application Priority Data

Jun. 21, 2022    (CN) .......................... 202221566090.7

(51) Int. Cl.
H05K 7/20           (2006.01)
(52) U.S. Cl.
CPC ..... H05K 7/20972 (2013.01); H05K 7/20145 (2013.01); H05K 7/20172 (2013.01)
(58) Field of Classification Search
CPC .. G06F 1/20; H05K 7/20972; H05K 7/20145; H05K 7/20172; H05K 7/202
See application file for complete search history.

(56) References Cited

U.S. PATENT DOCUMENTS

| | | | | |
|---|---|---|---|---|
| 5,831,374 | A * | 11/1998 | Morita ............... | H05K 7/20963 |
| | | | | 313/493 |
| 10,905,035 | B2 * | 1/2021 | Whitehead ......... | H05K 7/20209 |
| 11,252,849 | B2 * | 2/2022 | Whitehead ........ | G02F 1/133385 |
| 11,910,582 | B2 * | 2/2024 | Kim .................. | H05K 7/20972 |
| 2018/0020579 | A1 * | 1/2018 | Chang ............... | H05K 7/20154 |
| 2019/0021189 | A1 * | 1/2019 | Kim .................. | H05K 7/20972 |
| 2020/0245512 | A1 * | 7/2020 | Kang ........................ | G09F 9/33 |
| 2023/0021970 | A1 * | 1/2023 | Lee .......................... | H05K 5/03 |
| 2023/0095355 | A1 * | 3/2023 | Lee ................... | G02F 1/133331 |
| | | | | 349/161 |
| 2024/0292561 | A1 * | 8/2024 | Dunn ................. | H05K 7/20972 |

* cited by examiner

*Primary Examiner* — Stephen S Sul

(57)                   ABSTRACT

The application provides a display cooled by internal and external airflows circulation. The display comprises a shell, a fan module, a heat exchanger and a display module for displaying information, wherein the display module comprises a display panel, a heat dissipation plate and a module backplane. One or more internal circulation air ducts and external circulation air ducts are arranged on the heat exchanger. The fan module drives air in the shell to pass through the internal circulation air ducts and the inside of the display module, and pass through the heat dissipation plate to form internal circulation airflow. The shell is provided with an external circulation ventilation structure leading to an external circulation air duct, and the fan module drives the air inside and outside the shell to pass through the external circulation ventilation structure to form external circulation airflow.

17 Claims, 10 Drawing Sheets

P 132
131

131
132
131
132

51

R

S

S

R

R-R

DISPLAY COOLED BY INTERNAL AND EXTERNAL AIRFLOWS CIRCULATION

CROSS REFERENCE TO RELATED APPLICATIONS

The present application claims the benefit of Chinese Patent Application No. 202221566090.7 filed on Jun. 21, 2022, the contents of which are incorporated herein by reference in their entirety.

BACKGROUND OF THE INVENTION

1. Technical Field

The application relates to the technical field of displays, in particular to a display cooled by internal and external airflow circulation.

2. Description of Related Art

A display is an output device that displays images and colors. Common displays are the screens of computers, televisions, and displays used to display information outdoors.

In the past, due to the influence of external environmental factors, many outdoor displays need to install fans to cool the internal devices of the displays to ensure the normal work of the displays, but because the fans are directly used to blow the interior of the displays, dust or moisture in the external environment is also blown into the interior of the display, indirectly reducing the service life of the display. And the inside of the display needs to be cleaned regularly by people, which is troublesome to maintain.

BRIEF SUMMARY OF THE INVENTION

The technical problem to be solved by the application is to provide an improved display aiming at the defects in the related art.

The technical scheme adopted by the application to solve the technical problem comprises: providing a display cooled by internal and external airflows circulation, comprising a shell, a fan module, a heat exchanger and a display module for displaying information, wherein the fan module, the heat exchanger and the display module are arranged in the shell;

The display module comprises a display panel, a heat dissipation plate and a module backplane, wherein the display panel is used for displaying information, the heat dissipation plate is arranged behind the display panel, and the module backplane is arranged behind the heat dissipation plate;

The heat exchanger is provided with one or more internal circulation air ducts and one or more external circulation air ducts which are separated from each other. The fan module drives the air in the shell to pass through the internal circulation air ducts of the heat exchanger and the inside of the display module and pass through the heat dissipation plate to form internal circulation airflow;

The shell is provided with an external circulation ventilation structure leading to the external circulation air ducts of the heat exchanger, and the fan module drives air inside and outside the shell to pass through the external circulation ventilation structure to form external circulation airflow.

Preferably, the display module further comprises a backlight panel, and the backlight panel is arranged behind the display panel and in front of the heat dissipation plate.

Preferably, in the width or height direction of the display, both sides of the display module are provided with a first module vent hole and a second module vent hole for the internal circulation airflow to pass in and out.

Preferably, the heat dissipation plate comprises a plurality of peaks and a plurality of troughs, and space defined by the troughs form gaps through which an airflow on the heat dissipation plate passes between the display panel and the module backplane.

Preferably, the heat dissipation plate is a corrugated plate.

Preferably, the display comprises a transparent plate, the transparent plate is mounted on the shell and arranged in front of the display module, the display module displays information through the transparent plate, and a gap for airflow to pass through is formed between the display module and the transparent plate; and the fan module drives air in the shell to pass through the internal circulation air ducts of the heat exchanger and the gap between the display module and the transparent plate to form internal circulation airflow.

Preferably, in the width or height direction of the display, the two sides of the display module are the positions where the internal circulation airflow in and out of the gap between the display module and the transparent plate.

Preferably, in the thickness direction of the display, one side of the heat exchanger facing the display module is provided with a first internal circulation opening communicated with the internal circulation air ducts, and one side of the heat exchanger facing the back of the shell is provided with a first external circulation opening communicated with the internal circulation air ducts;

In the width or height direction of the display, one side of the heat exchanger is provided with a second internal circulation opening communicated with the internal circulation air ducts, and the other side of the heat exchanger is provided with a second external circulation opening communicated with the external circulation air ducts.

The fan module drives air to pass through the first internal circulation opening, the internal circulation air ducts, the second internal circulation opening and the heat dissipation plate to form internal circulation airflow.

And the external circulation ventilation structure comprises a first external circulation vent hole and a second external circulation vent hole, the back of the shell is provided with the first external circulation vent hole which corresponds to the first external circulation opening and is communicated with the inside and the outside of the shell, and the side of the shell is provide with a second external circulation vent hole which corresponds to the second external circulation opening and is communicated with the inside and the outside of the shell. The fan module drives air to pass through the first external circulation vent hole, the first external circulation opening, the external circulation air ducts of the heat exchanger, the second external circulation opening and the second external circulation vent hole to form external circulation airflow.

Preferably, the display module is provided with a first module vent hole and a second module vent hole for the first internal circulation airflow to pass through respectively at two sides corresponding to the first internal circulation opening and the second internal circulation opening, and the first module vent hole and the second module vent hole are communicated with the gaps on the heat dissipation plate.

Preferably, the fan module comprises a first fan and a second fan, the first fan is arranged at the second internal circulation opening, and the second fan is arranged at the second external circulation opening.

The implementation of the technical scheme of the application has at least the following beneficial effects: the display can be provided with a heat dissipation plate in the display module, which is combined with a heat exchanger to form an internal circulation airflow and an external circulation airflow. The two airflows are completely separated independently, which ensures the cleanness of the air inside the display while realizing heat dissipation, and is not affected by the external air, thereby reducing the failure rate of the display.

BRIEF DESCRIPTION OF THE SEVERAL VIEWS OF THE DRAWINGS

In order to more clearly illustrate the technical solutions in the embodiments of the application, the following will briefly introduce the embodiments or the drawings required to be used in the description of the prior art. Obviously, the drawings in the following description are only some embodiments of the application. For those of ordinary skill in the art, other figures may also be derived from these figures.

Figure 1:
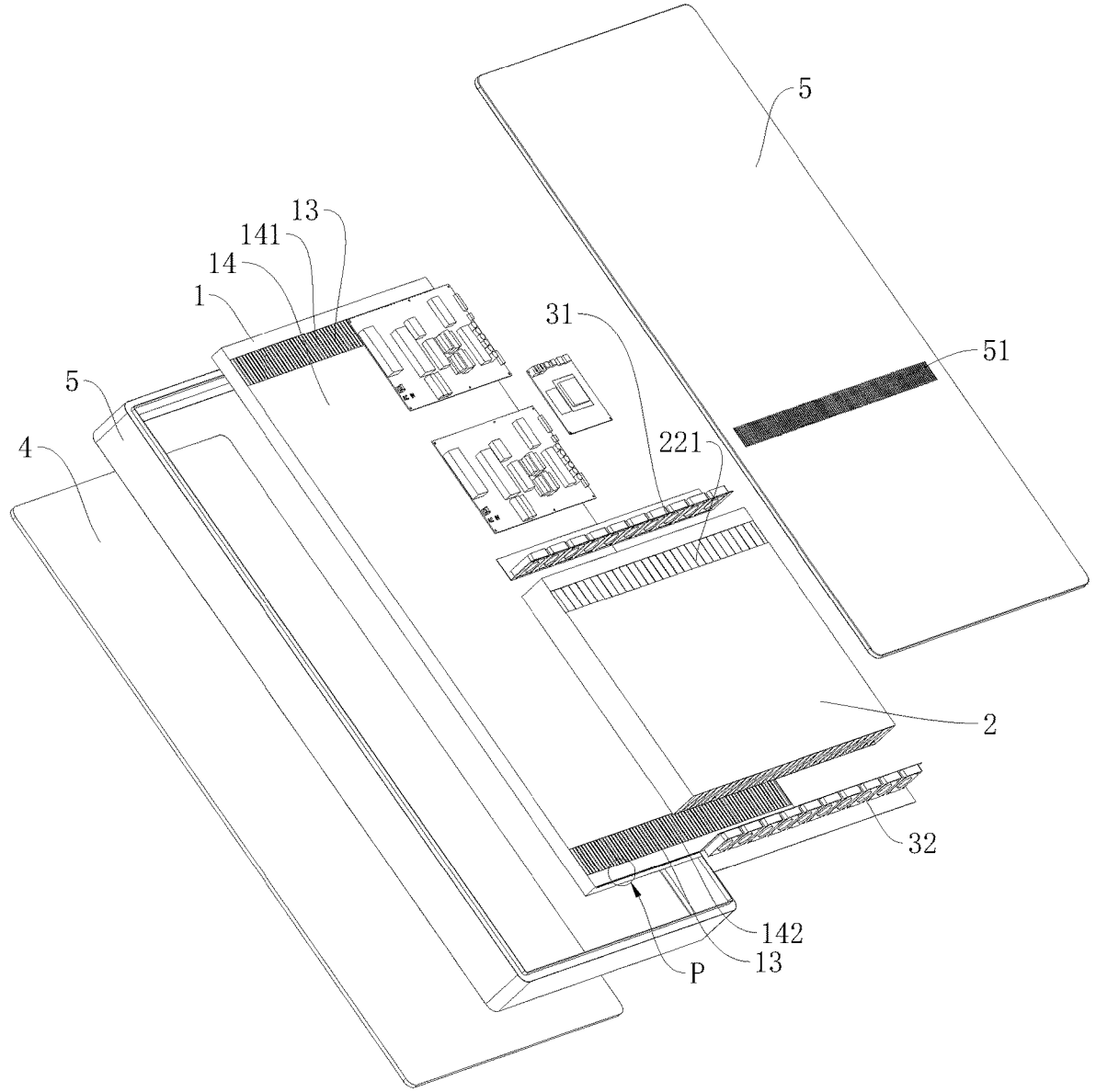
FIG. 1 is an exploded view of a display cooled by internal and external airflows circulation according to an embodiment of the application.

Reference numerals in the figure denote a display module 1, a display panel 11, a backlight panel 12, a heat dissipation plate 13, peak 131, trough 132, a module backplane 14, first module vent holes 141, second module vent holes 142, a heat exchanger 2, an internal circulation air duct A, an external circulation air duct B, a first internal circulation opening 211, a second internal circulation opening 212, A first external circulation opening 221, a second external circulation opening 222, a first fan 31, a second fan 32, a transparent plate 4, a shell 5, an external circulation ventilation structure 50, a first external circulation vent hole 51, and a second external circulation vent hole 52.

DETAILED DESCRIPTION OF THE INVENTION

In order to have a clearer understanding of the technical features, purposes and effects of the application, the specific embodiments of the application are described in detail with reference to the drawings. It should be understood that if the appearance of "positive", "negative", "upper" and "lower" in the text indicates that the orientation or positional relationship is based on the orientation or positional relationship shown in the drawings and is constructed and operated in a specific orientation, it is only for the convenience of describing the technical solution, and does not indicate that the device or element referred to must have a specific orientation. Therefore, it should not be interpreted as a limitation to the application. It should also be noted that, unless otherwise specified and limited, the terms "mounting", "connecting", "connecting", "fixing" and "setting" should be interpreted in a broad sense, for example, fixed connection, detachable connection or integration; It can be directly connected or indirectly connected through an intermediate medium, and it can be the internal connection of two components or the interaction relationship of two components. When an element is referred to as being "on" or "under" another element, the element can be "directly" or "indirectly" on the other element, or there may be one or more intervening elements. The terms "first", "second", etc., if any, are used herein only for the convenience of description and shall not be construed as indicating or implying a relative importance or an implied number of the indicated features, thus, the features defined with "first", "second", etc. May be expressly or implicitly defined as including one or more of the features. Those of ordinary skill in the art can understand the specific meaning of the above terms in the present invention according to specific situations.

In the following description, for purposes of explanation and not limitation, specific details are set forth such as the particular system architecture, techniques, etc., in order to provide a thorough understanding of the present invention. However, it will be apparent to those skilled in the art that the present invention may be practiced in other embodiments without these specific details. In other instances, detailed descriptions of well-known systems, devices, circuits, and methods are omitted so as not to obscure the description of the present invention with unnecessary detail.

Referring to FIGS. 1-11, a display cooled by internal and external airflows according to an embodiment of the present application comprises a shell 5, a fan module, a heat exchanger 2, and a display module 1 for displaying information. The fan module, the heat exchanger 2, and the display module 1 are disposed in the shell 5.

The display module 1 comprises a display panel 11 for displaying information, a heat dissipation plate 13 provided behind the display panel 11, and a module backplane 14 provided behind the heat dissipation plate 13.

The heat exchanger 2 is provided with one or more internal circulation air ducts A and one or more external circulation air ducts B which are separated from each other, and the fan module drives the air in the shell 5 to pass through the internal circulation air ducts A of the heat exchanger 2 and the inside of the display module 1, and pass through the heat dissipation plate 13 to form an internal circulation airflow.

The shell 5 is provided with an external circulation ventilation structure 50 leading to the external circulation air ducts B of the heat exchanger 2, and the fan module drives the air inside and outside the shell 5 to pass through the external circulation ventilation structure 50 to form an external circulation airflow.

The heat dissipation plate 13 and the display module 1 are subjected to steam flow diversion. The internal circulation airflow passes through the heat dissipation plate 13 and collects and transfers heat to the inside of the heat exchanger 2 when passing through the internal circulation air ducts A of the heat exchanger 2. The external circulation airflow exchanges heat with the internal circulation air ducts A inside the heat exchanger to realize heat dissipation when passing through the external circulation air ducts B.

According to the display, the heat dissipation plate 13 is arranged in the display module 1 and combined with the heat exchanger 2 to form two airflows of internal circulation and external circulation, wherein the two airflows of the internal circulation and the external circulation are completely independent and do not influence each other.

The display panel 11 may be a liquid crystal display panel, and the transparent plate 4 may be glass, preferably tempered glass.

For the internal circulation part, preferably, the display module 1 further comprises a backlight panel 12 laminated with the display panel 11. The backlight panel 12 is disposed behind the display panel 11 and in front of the heat dissipation plate 13. The heat dissipation plate 13 exchanges heat with the backlight panel 12 to dissipate heat through the internal circulation airflow.

Figure 6:
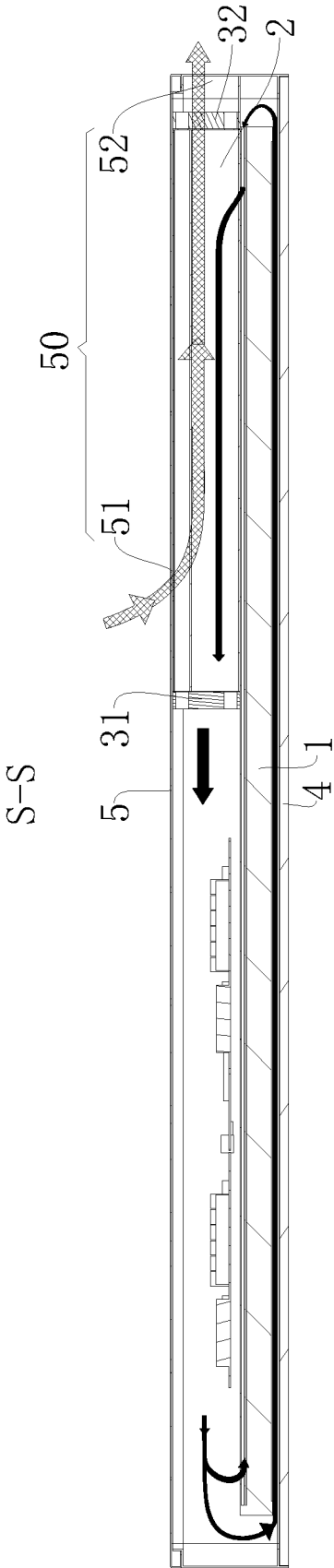
FIG. 6 is a sectional view of the S-S position in FIG. 3 (the solid arrow indicates the internal circulation airflow, and the grid arrow indicates the external circulation airflow).
Figure 7:
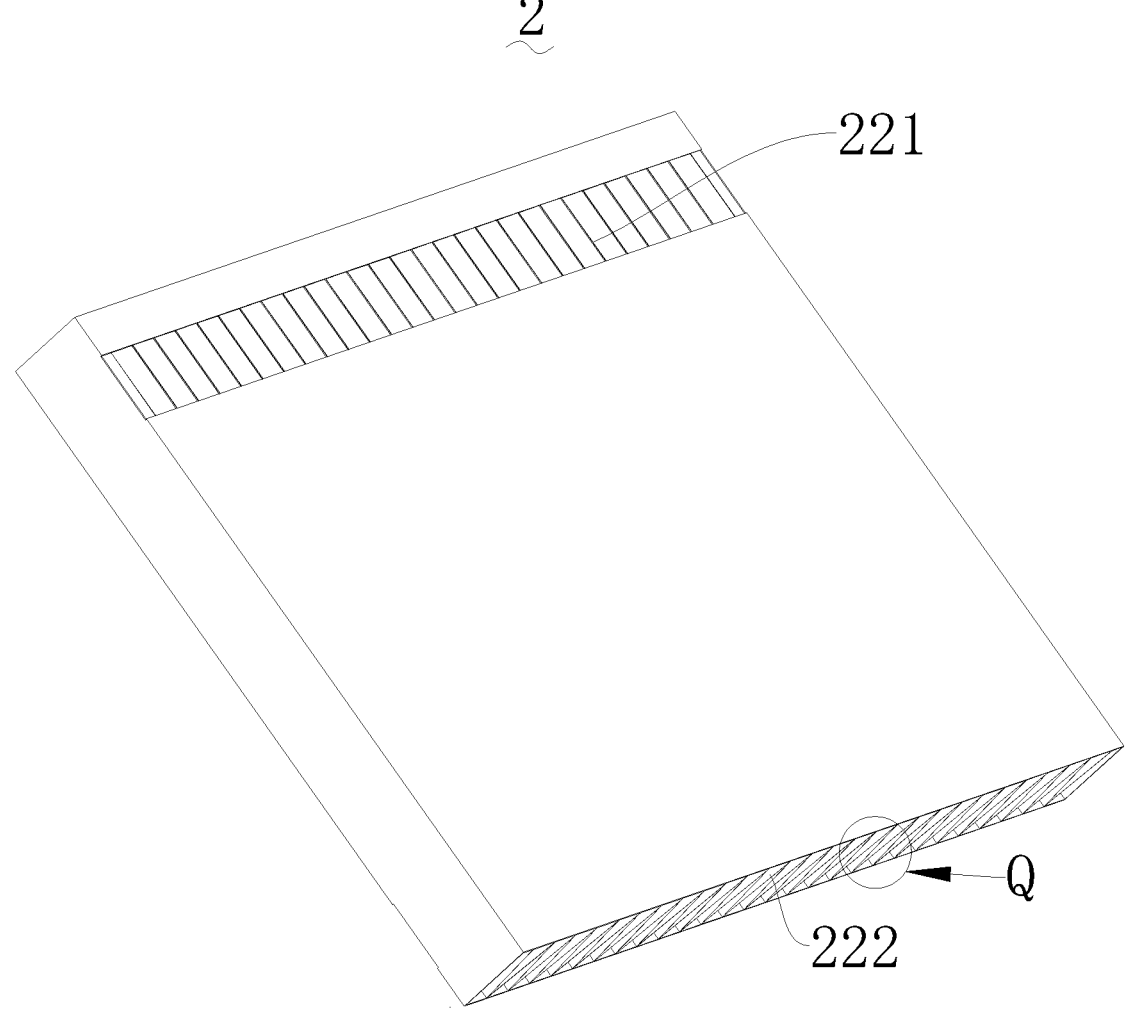
FIG. 7 is a perspective view of the heat exchanger of FIG. 1.
Figure 8:
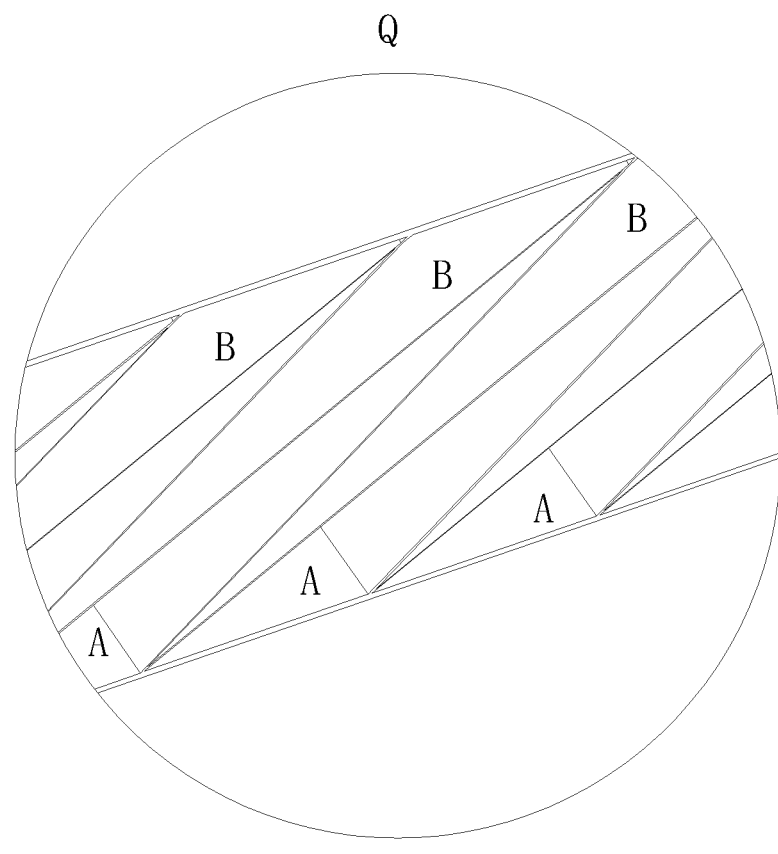
FIG. 8 is a partial enlarged view of a portion Q in FIG. 7.
Figure 9:
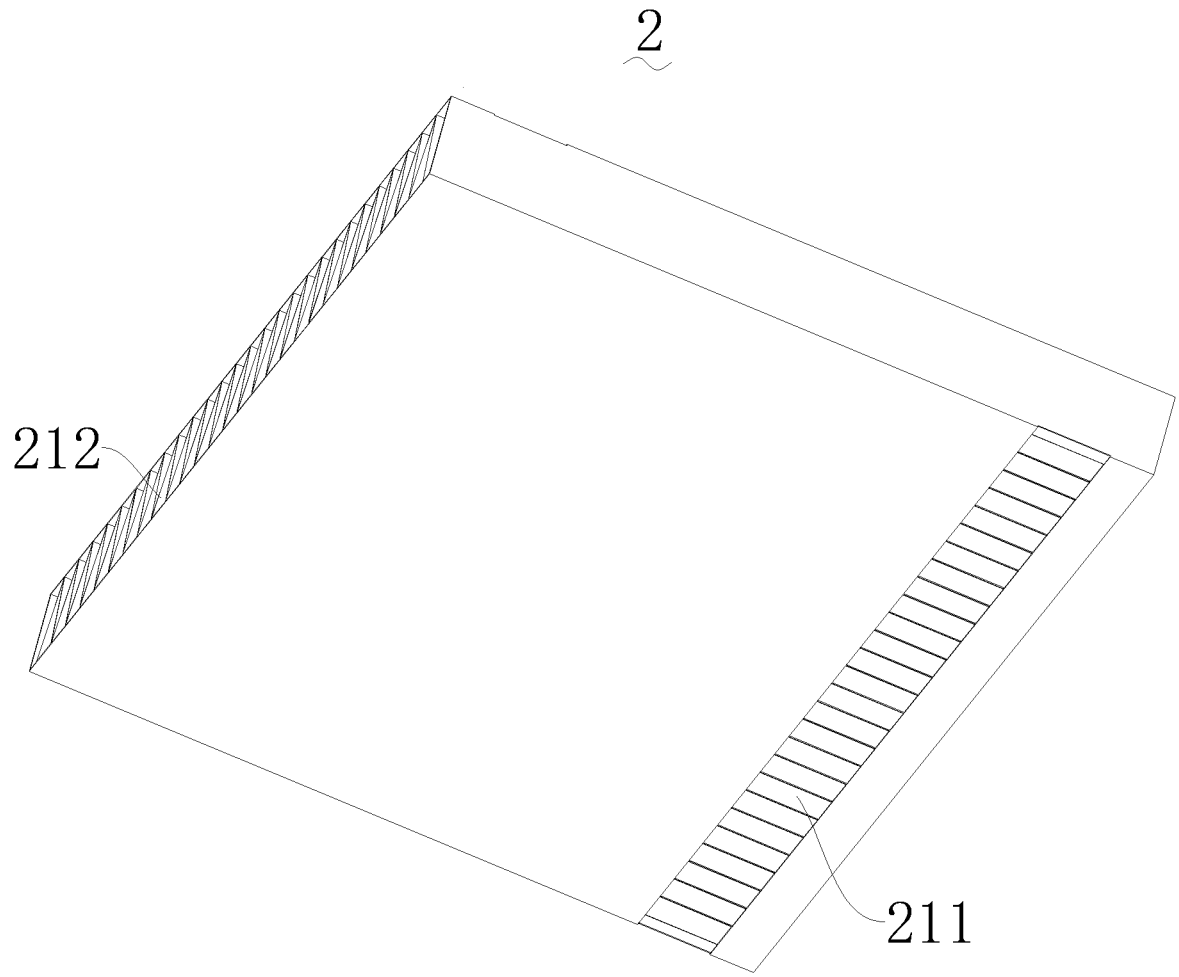
FIG. 9 is a perspective view of the heat exchanger of FIG. 1 from another perspective.
Figure 10:
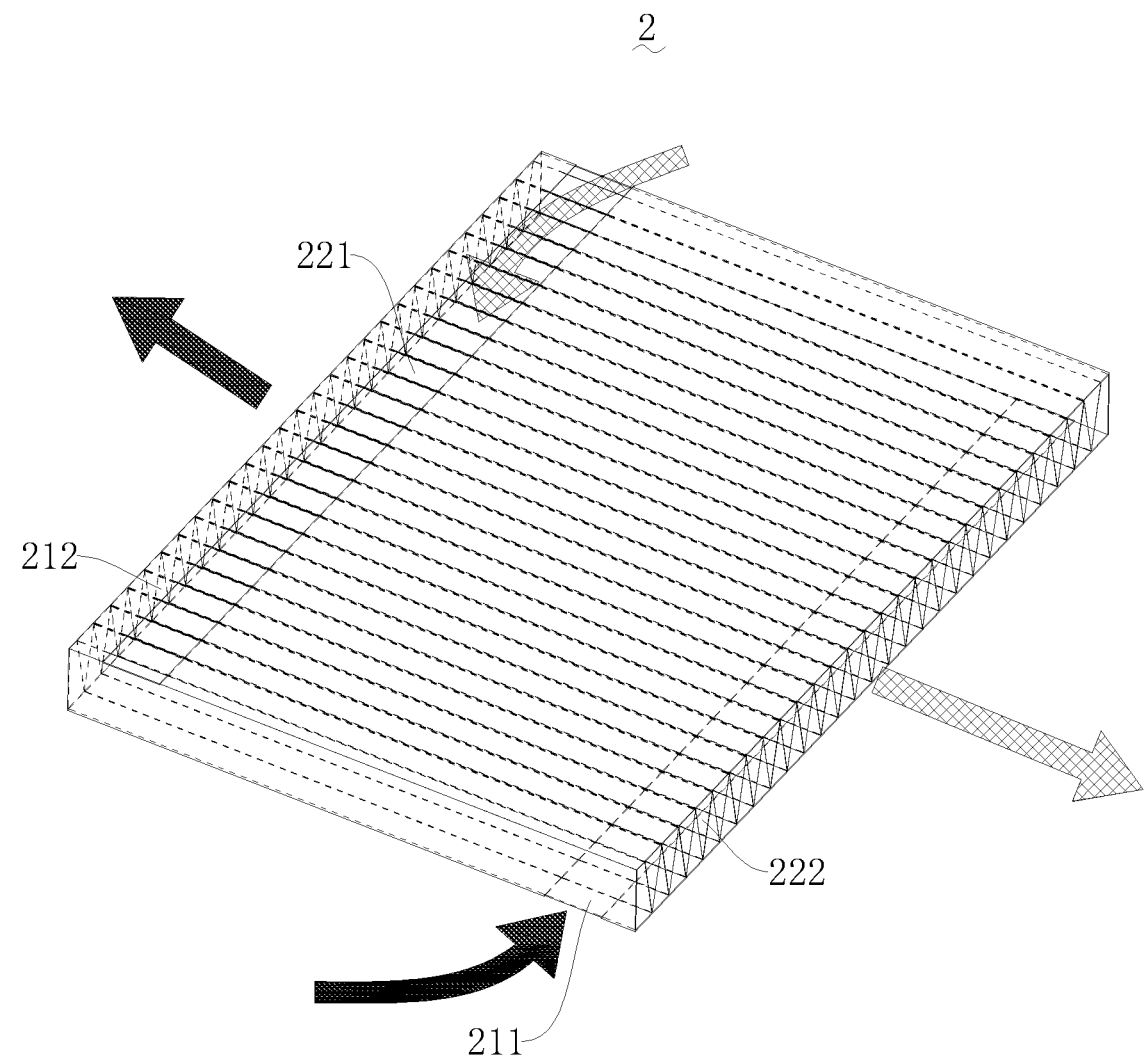
FIG. 10 is a perspective view of the heat exchanger of FIG. 1 (dashed lines indicate invisible outlines; solid arrows indicate internal recycle airflow and gridded arrows indicate external recycle airflow).
Figure 11:
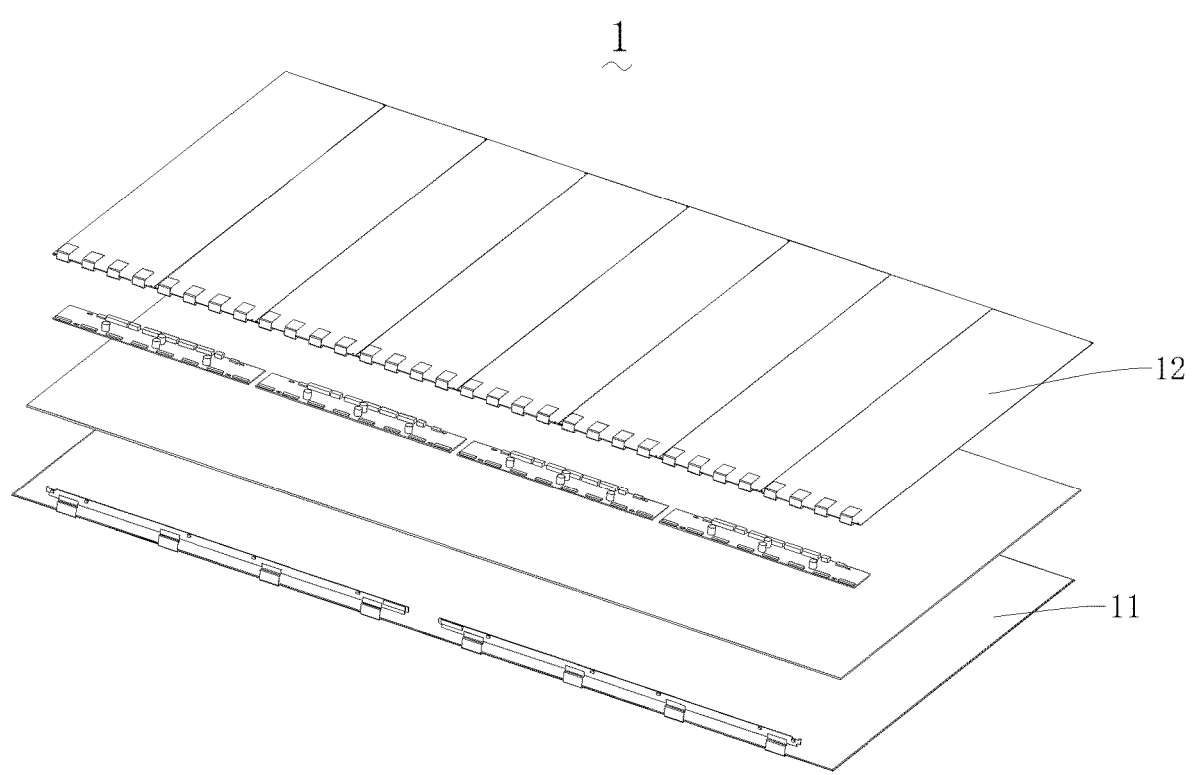
FIG. 11 is an exploded view of a part of the display module of FIG. 1.

Preferably, referring to FIG. 6, in the width or height direction of the display, the first module vent hole 141 and the second module vent hole 142 are provided on both sides of the display module 1 for the internal circulation airflow to pass in and out. So that the internal circulation airflow flows inside the display along the width or height direction of the display to maximize the contact area between the internal circulation airflow and the display module 1. And that heat dissipation effect is improved.

Figure 2:
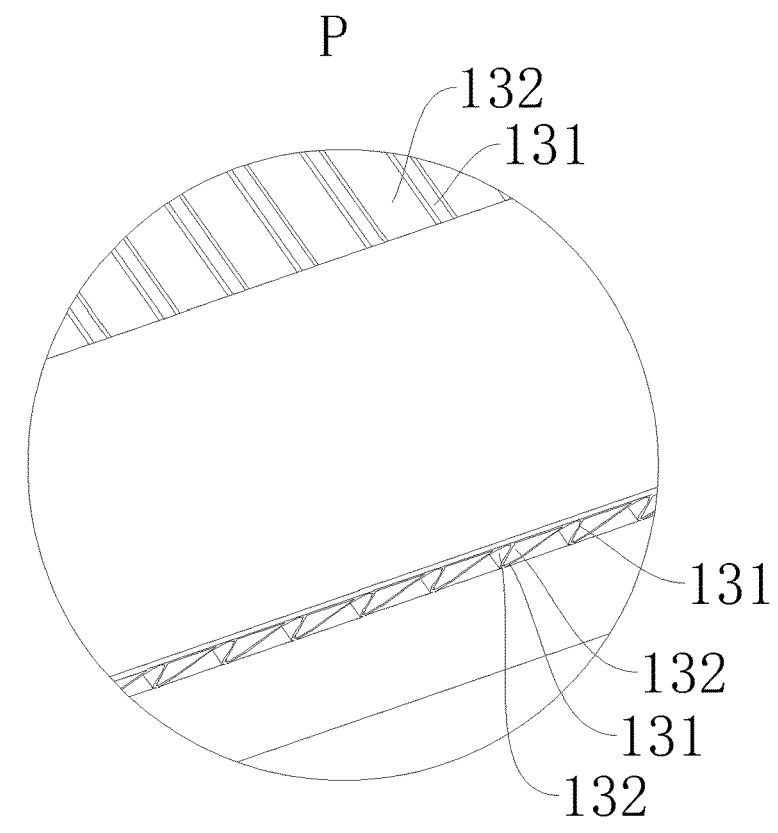
FIG. 2 is a partial enlarged view of a portion P in FIG. 1.
Figure 3:
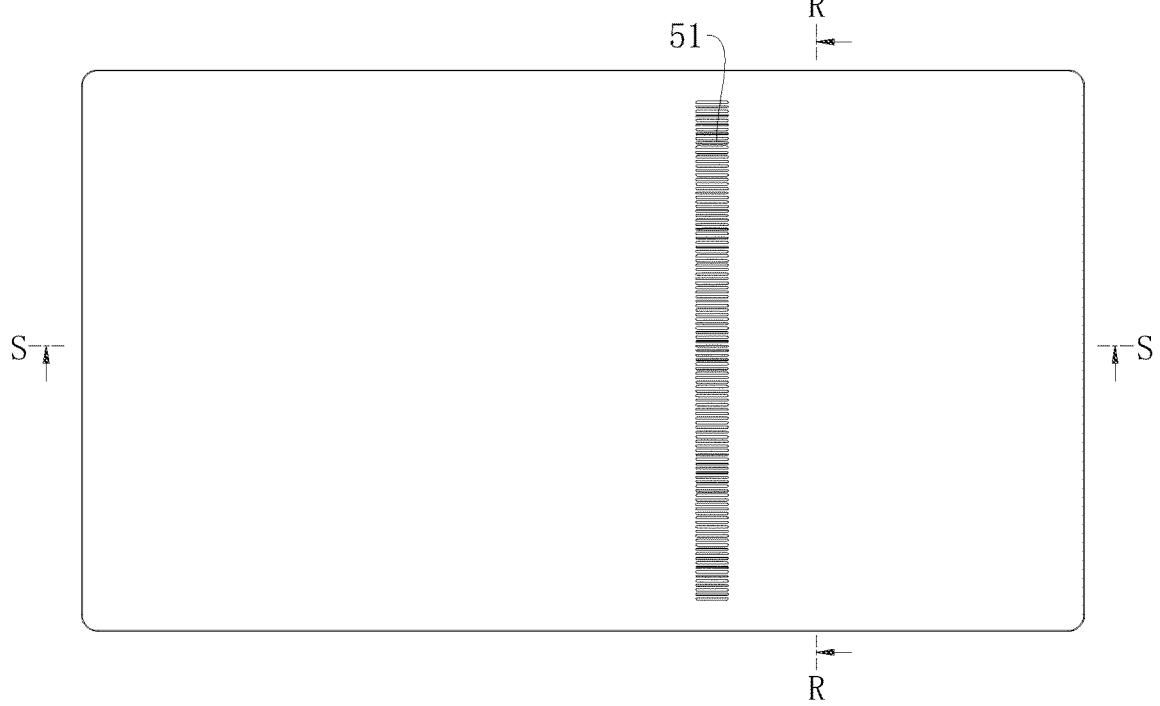
FIG. 3 is a rear view of the display of FIG. 1.
Figure 4:
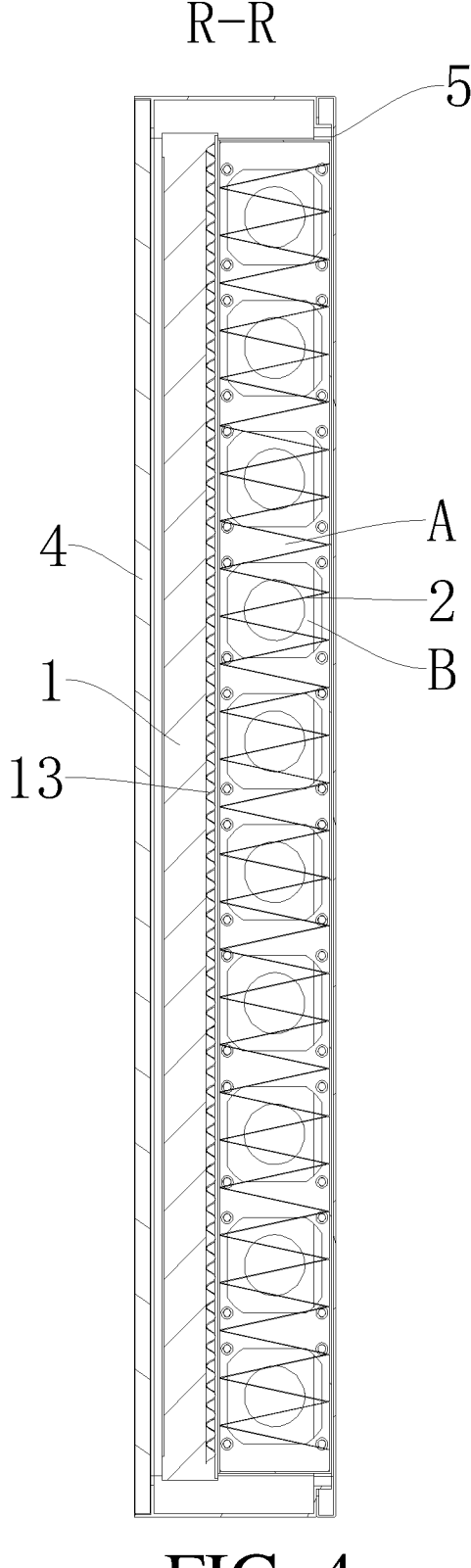
FIG. 4 is a sectional view of the R-R position in FIG. 3.
Figure 5:
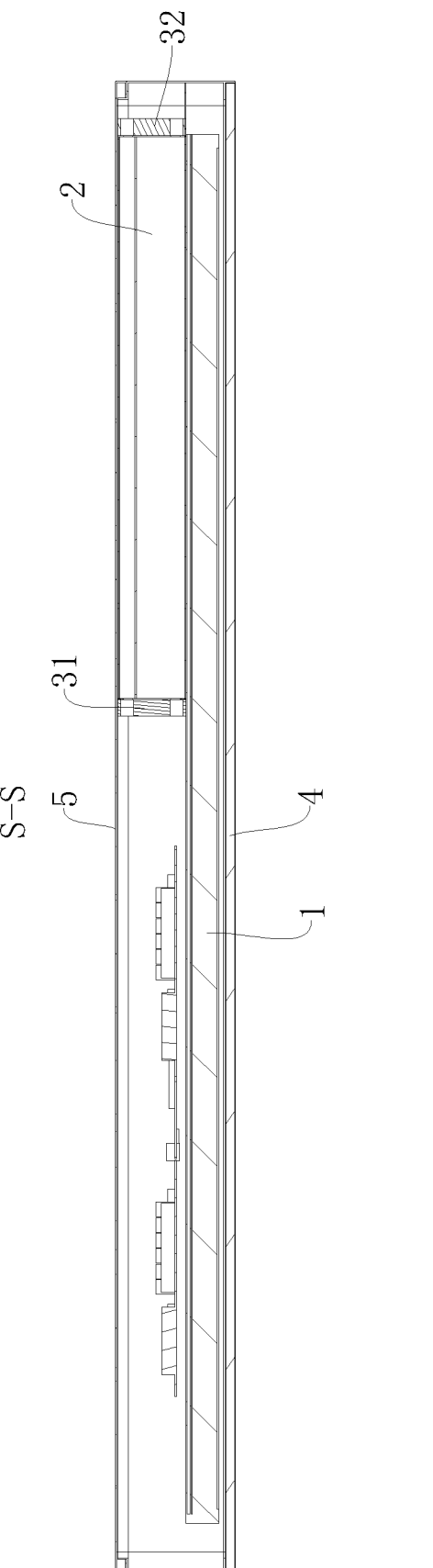
FIG. 5 is a sectional view of the S-S position in FIG. 3.

Preferably, referring to FIG. 2, the heat dissipation plate 13 comprises a plurality of peaks 131 and a plurality of troughs 132, and spaces defined by the troughs 132 form gaps for an airflow on the heat dissipation plate 13 to pass through between the display panel 11 and the module backplane 14, so as to further improve the heat dissipation effect of the internal circulation airflow on the display module 1.

More preferably, the heat dissipation plate 13 is a corrugated plate. And more specifically, the heat dissipation plate 13 is a composite plate having a corrugated feature such that peaks 131 and troughs 132 are formed on both sides.

As for the internal circulation part, preferably, the display comprises a transparent plate 4, the transparent plate 4 is mounted on the shell 5 and arranged in front of the display module 1. The display module 1 displays information through the transparent plate 4. A gap for airflow to pass through is provided between the display module 1 and the transparent plate 4. The fan module drives the air in the shell 5 to pass through the internal circulation air ducts A of the heat exchanger 2 and the gap between the display module 1 and the transparent plate 4 to form an internal circulation airflow. When the internal circulation airflow passes through the gap between the display module 1 and the transparent plate 4, it exchanges heat with the display module 1 to achieve heat dissipation.

More preferably, referring to FIG. 6, in the width or height direction of the display, the two sides of the display module 1 are the positions where the internal circulation airflow in and out of the gap between the display module 1 and the transparent plate 4, so that the internal circulation airflow inside the display along the width or height direction of the display, which increases the contact area between the internal circulation airflow and the display module 1 as much as possible and improves the heat dissipation effect.

As for the external circulation part, preferably, referring to FIGS. 1-10, in the thickness direction of the display, one side of the heat exchanger 2 facing the display module 1 is provided with a first internal circulation opening 211 communicated with the internal circulation air ducts A, and one side of the heat exchanger 2 facing the back of the housing 5 is provided with a first external circulation opening 221 communicated with the internal circulation air ducts A. That is, the first internal circulation opening 211 and the first external circulation opening 221 are provided on opposite surfaces of the heat exchanger 2.

In the width or height direction of the display, one side of the heat exchanger 2 is provided with a second internal circulation opening 212 communicating with the internal circulation air ducts A, and the other side is provided with a second external circulation opening 222 communicating with the external circulation air ducts B. that is, the second internal circulation opening 212 and the second external circulation opening 222 are provided on opposite sides of the heat exchanger 2.

The fan module drives air to pass through the first internal circulation opening 211, the internal circulation air ducts A, the second internal circulation opening 212, the heat dissipation plate 13, and the gap between the display module 1 and the transparent plate 4 to form an internal circulation airflow.

The external circulation ventilation structure 50 comprises a first external circulation vent hole 51 and a second external circulation vent hole 52. The back of the shell 5 is provided with the first external circulation vent hole 51 corresponding to the first internal circulation opening 221 and communicating the inside and outside of the shell 5. In the width or height direction of the display, the side of the shell 5 is provided with the second external circulation vent hole 52 corresponding to the second external circulation opening 222 and communicating the inside and outside of the shell 5. The fan module drives the air to pass through the first external circulation vent hole 51, the first external circulation opening 221, the external circulation air ducts B of the heat exchanger 2, the second external circulation opening 222 and the second external circulation vent hole 52 to form an external circulation airflow.

So that the flow directions of the internal circulation airflow and the external circulation airflow are opposite. The airflows do not interfere with each other, the flexible arrangement of the two airflows is facilitated, the application scene is wider, and the heat exchange effect is better.

More preferably, the display module 1 defines a first module vent hole 141 and a second module vent hole 142 corresponding to the first internal circulation opening 211 and the second internal circulation opening 212 respectively. The first module vent hole 141 and the second module vent hole 142 are communicated with gaps on the heat dissipation plate 13 for the airflow to pass through.

More preferably, the fan module comprises a first fan 31 and a second fan 32. The first fan 31 is disposed at the second internal circulation opening 212, and the second fan 32 is disposed at the second external circulation opening 222.

To sum up, the display can be provided with the heat dissipation plate 13 in the display module 1, and combined with the heat exchanger 2, two airflows of internal circulation and external circulation are formed. The two airflows are completely separated independently, so that the cleanness of the air inside the display is ensured while the heat dissipation is realized, and the air is not affected by the external air, thereby reducing the failure rate of the display.

The above description is only a preferred embodiment of the application, and is not intended to limit the application. For those skilled in the art, the application can have various modifications, combinations and changes. Any modification, equivalent substitution, improvement, etc. within the spirit and principle of the application shall be comprised in the scope of the claims of the application.

What is claimed is:

1. A display cooled by internal circulation airflow and external circulation airflow, comprising: a shell (5), a fan module, a heat exchanger (2), a display module (1), and a transparent plate (4), wherein the fan module, the heat exchanger (2) and the display module (1) are arranged in the shell (5);

the display module (1) comprises a display panel (11) for displaying information, a heat dissipation plate (13) arranged behind the display panel (11), and a module backplane (14) arranged behind the heat dissipation plate (13); the heat dissipation plate (13) comprises a plurality of peaks (131) and a plurality of troughs (132), and spaces defined by the plurality of troughs (132) form first gaps through which the internal circulation airflow on the heat dissipation plate (13) passes between the display panel (11) and the module backplane (14);

the transparent plate (4) is mounted on the shell (5) and is arranged in front of the display module (1), the display module (1) displays the information through the transparent plate (4), and a second gap for the internal circulation airflow to pass through is provided between the display module (1) and the transparent plate (4);

the heat exchanger (2) is provided with one or more internal circulation air ducts (A) and one or more external circulation air ducts (B) which are separated from each other, each of the one or more internal circulation air ducts (A) and the one or more external circulation air ducts (B) is in a L shape; the fan module drives air in the shell (5) to pass through the one or more internal circulation air ducts (A) of the heat exchanger (2), the first gaps, the second gap to form the internal circulation airflow; paths of the internal circulation airflow in the one or more internal circulation air ducts (A), the first gaps, and the second gap are substantially parallel;

the shell (5) is provided with an external circulation ventilation structure (50) leading to the one or more external circulation air ducts (B) of the heat exchanger (2), and the fan module drives the air inside and outside the shell (5) to pass through the external circulation ventilation structure (50) to form the external circulation airflow.

2. The display according to claim 1, wherein the display module (1) further comprises a backlight panel (12), and the backlight panel (12) is arranged behind the display panel (11) and in front of the heat dissipation plate (13).

3. The display according to claim 2, wherein in a thickness direction of the display, a first internal circulation opening (211) communicating with the one or more internal circulation air ducts (A) is provided on a side of the heat exchanger (2) facing the display module (1), and a first external circulation opening (221) communicating with the one or more internal circulation air ducts (A) is provided on a side facing a back of the shell (5);

in a width or height direction of the display, a second internal circulation opening (212) communicating with the one or more internal circulation air ducts (A) is provided on one side of the heat exchanger (2), and a second external circulation opening (222) communicating with the one or more external circulation air ducts (B) is provided on another side;

the fan module drives the air to pass through the first internal circulation opening (211), the one or more internal circulation air ducts (A), the second internal circulation opening (212) and the heat dissipation plate (13) to form the internal circulation airflow;

the external circulation ventilation structure (50) comprises a first external circulation vent hole (51) and a second external circulation vent hole (52), and the back of the shell (5) is provided with the first external circulation vent hole (51) which corresponds to the first external circulation opening (221) and is communicated with the inside and outside of the shell (5); a side surface of the shell (5) is provided with the second external circulation vent hole (52) which corresponds to the second external circulation opening (222) and is communicated with the inside and the outside of the shell (5); the fan module drives the air to pass through the first external circulation vent hole (51), the first external circulation opening (221), the one or more external circulation air ducts (B) of the heat exchanger (2), the second external circulation opening (222) and the second external circulation vent hole (52) to form the external circulation airflow.

4. The display according to claim 3, wherein the display module (1) is provided with a first module vent hole (141) and a second module vent hole (142) corresponding to the first internal circulation opening (211) and the second internal circulation opening (212) respectively, the first module vent hole (141) and the second module vent hole (142) open into the first gaps on the heat dissipation plate (13).

5. The display according to claim 3, wherein the fan module comprises a first fan (31) and a second fan (32), wherein the first fan (31) is arranged at the second internal circulation opening (212), and the second fan (32) is arranged at the second external circulation opening (222).

6. The display according to claim 1, wherein in a width or height direction of the display, a first module vent hole (141) and a second module vent hole (142) are respectively provided on both sides of the display module (1) for the internal circulation airflow to pass in and out.

7. The display according to claim 6, wherein in a thickness direction of the display, a first internal circulation opening (211) communicating with the one or more internal circulation air ducts (A) is provided on a side of the heat exchanger (2) facing the display module (1), and a first external circulation opening (221) communicating with the one or more internal circulation air ducts (A) is provided on a side facing a back of the shell (5);

in a width or height direction of the display, a second internal circulation opening (212) communicating with the one or more internal circulation air ducts (A) is provided on one side of the heat exchanger (2), and a second external circulation opening (222) communicating with the one or more external circulation air ducts (B) is provided on another side;

the fan module drives the air to pass through the first internal circulation opening (211), the one or more internal circulation air ducts (A), the second internal circulation opening (212) and the heat dissipation plate (13) to form the internal circulation airflow;

the external circulation ventilation structure (50) comprises a first external circulation vent hole (51) and a second external circulation vent hole (52), and the back of the shell (5) is provided with the first external circulation vent hole (51) which corresponds to the first external circulation opening (221) and is communicated with the inside and outside of the shell (5); a side surface of the shell (5) is provided with the second external circulation vent hole (52) which corresponds to the second external circulation opening (222) and is communicated with the inside and the outside of the shell (5); the fan module drives the air to pass through the first external circulation vent hole (51), the first external circulation opening (221), the one or more external circulation air ducts (B) of the heat exchanger (2), the second external circulation opening (222) and the second external circulation vent hole (52) to form the external circulation airflow.

8. The display according to claim 7, wherein the display module (1) is provided with a first module vent hole (141) and a second module vent hole (142) corresponding to the first internal circulation opening (211) and the second internal circulation opening (212) respectively, the first module vent hole (141) and the second module vent hole (142) open into the first gaps on the heat dissipation plate (13).

9. The display according to claim 7, wherein the fan module comprises a first fan (31) and a second fan (32), wherein the first fan (31) is arranged at the second internal circulation opening (212), and the second fan (32) is arranged at the second external circulation opening (222).

10. The display according to claim 1, wherein the heat dissipation plate (13) is a corrugated plate.

11. The display according to claim 10, wherein in a thickness direction of the display, a first internal circulation opening (211) communicating with the one or more internal circulation air ducts (A) is provided on a side of the heat exchanger (2) facing the display module (1), and a first external circulation opening (221) communicating with the one or more internal circulation air ducts (A) is provided on a side facing a back of the shell (5);

in a width or height direction of the display, a second internal circulation opening (212) communicating with the one or more internal circulation air ducts (A) is provided on one side of the heat exchanger (2), and a second external circulation opening (222) communicating with the one or more external circulation air ducts (B) is provided on another side;

the fan module drives the air to pass through the first internal circulation opening (211), the one or more internal circulation air ducts (A), the second internal circulation opening (212) and the heat dissipation plate (13) to form the internal circulation airflow;

the external circulation ventilation structure (50) comprises a first external circulation vent hole (51) and a second external circulation vent hole (52), and the back of the shell (5) is provided with the first external circulation vent hole (51) which corresponds to the first external circulation opening (221) and is communicated with the inside and outside of the shell (5); the side surface of the shell (5) is provided with the second external circulation vent hole (52) which corresponds to the second external circulation opening (222) and is communicated with the inside and the outside of the shell (5); the fan module drives the air to pass through the first external circulation vent hole (51), the first external circulation opening (221), the one or more external circulation air ducts (B) of the heat exchanger (2), the second external circulation opening (222) and the second external circulation vent hole (52) to form the external circulation airflow.

12. The display according to claim 1, wherein in a width or height direction of the display, two sides of the display module (1) are the positions where the internal circulation airflow flows in and out of the second gap between the display module (1) and the transparent plate (4).

13. The display according to claim 1, wherein a first internal circulation opening (211) communicating with the one or more internal circulation air ducts (A) is provided on a first side of the heat exchanger (2) facing the display module (1), and a first external circulation opening (221) communicating with the one or more external circulation air ducts (A) is provided on a second side facing a back of the shell (5); the second side is opposite to the first side;

a second internal circulation opening (212) communicating with the one or more internal circulation air ducts (A) is provided on a third side of the heat exchanger (2), and a second external circulation opening (222) communicating with the one or more external circulation air ducts (B) is provided on a fourth side; the third side is opposite to the fourth side, and each of the third side and the fourth side is connected between the first side and the second side;

the fan module drives the air to pass through the first internal circulation opening (211), the one or more internal circulation air ducts (A), the second internal circulation opening (212) and the heat dissipation plate (13) to form the internal circulation airflow;

the external circulation ventilation structure (50) comprises a first external circulation vent hole (51) and a second external circulation vent hole (52), and the back of the shell (5) is provided with the first external circulation vent hole (51) which corresponds to the first external circulation opening (221) and is communicated with the inside and outside of the shell (5); a side surface of the shell (5) is provided with the second external circulation vent hole (52) which corresponds to the second external circulation opening (222) and is communicated with the inside and the outside of the shell (5); the fan module drives the air to pass through the first external circulation vent hole (51), the first external circulation opening (221), the one or more external circulation air ducts (B) of the heat exchanger (2), the second external circulation opening (222) and the second external circulation vent hole (52) to form the external circulation airflow.

14. The display according to claim 13, wherein the display module (1) is provided with a first module vent hole (141) and a second module vent hole (142) corresponding to the first internal circulation opening (211) and the second internal circulation opening (212) respectively, the first module vent hole (141) and the second module vent hole (142) open into the first gaps on the heat dissipation plate (13).

15. The display according to claim 13, wherein the fan module comprises a first fan (31) and a second fan (32), wherein the first fan (31) is arranged at the second internal circulation opening (212), and the second fan (32) is arranged at the second external circulation opening (222).

16. A display cooled by internal circulation airflow and external circulation airflow, comprising: a shell (5), a fan module, a heat exchanger (2), a display module (1), wherein the fan module, the heat exchanger (2) and the display module (1) are arranged in the shell (5);

the display module (1) comprises a display panel (11) for displaying information, a heat dissipation plate (13) arranged behind the display panel (11), and a module backplane (14) arranged behind the heat dissipation plate (13); the heat dissipation plate (13) comprises a plurality of peaks (131) and a plurality of troughs (132), and spaces defined by the plurality of troughs (132) form first gaps through which the internal circulation airflow on the heat dissipation plate (13) passes between the display panel (11) and the module backplane (14);

the heat exchanger (2) is provided with a plurality of internal circulation air ductd (A) and a plurality of external circulation air ducts (B), each one of the plurality of internal circulation air ducts (A) and the plurality of external circulation air cuts (B) is in a L shape; the plurality of internal circulation air ducts (A) and the plurality of external circulation air ducts (B) are alternately arranged in the heat exchanger (2) and are spaced apart from each other, and air flow in the plurality of internal circulation air ducts (A) and the plurality of external circulation air ducts (B) is in an opposite direction, the fan module drives air in the shell (5) to pass through the plurality of internal circulation air ducts (A) of the heat exchanger (2) and the first gaps to form the internal circulation airflow; paths of the internal circulation airflow in the plurality of internal circulation air ducts (A), the first gaps, and a second gap are substantially parallel;

the shell (5) is provided with an external circulation ventilation structure (50) leading to the plurality of external circulation air ducts (B) of the heat exchanger (2), and the fan module drives the air to pass through the external circulation ventilation structure (50) and the plurality of external circulation air ducts (B) of the heat exchanger (2) to form the external circulation airflow.

17. The display according to claim 16, wherein the heat exchanger (2) comprises a plurality of spacer structures, each of the plurality of spacer structures has an N-shaped cross-section in a direction perpendicular to the display panel (11) and is configured to define one of the plurality of the plurality of internal circulation air duct (A) and one of the plurality of the plurality of external circulation air duct (B), each of the plurality of internal circulation air duct (A) has a first opening facing the module backplane (14) and each of the plurality of external circulation air duct (B) has a second opening facing the housing (5); the plurality of spacer structures are connected in sequence along the first direction, thereby defining the plurality of internal circulation air ducts (A) and the plurality of external circulation air ducts (B).

* * * * *